(12) United States Patent
Ueno et al.

(10) Patent No.: US 12,666,724 B2
(45) Date of Patent: Jun. 23, 2026

(54) SEMICONDUCTOR DEVICE ENABLING QUICK AND RELIABLE SCREENING

(71) Applicant: Mitsubishi Electric Corporation, Tokyo (JP)

(72) Inventors: Makoto Ueno, Fukuoka (JP); Kazuhiro Nishimura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 426 days.

(21) Appl. No.: 18/252,244

(22) PCT Filed: Feb. 19, 2021

(86) PCT No.: PCT/JP2021/006252
§ 371 (c)(1),
(2) Date: May 9, 2023

(87) PCT Pub. No.: WO2022/176141
PCT Pub. Date: Aug. 25, 2022

(65) Prior Publication Data
US 2023/0420445 A1 Dec. 28, 2023

(51) Int. Cl.
*H10D 89/60* (2025.01)
*H03K 17/0812* (2006.01)
*H10D 8/25* (2025.01)

(52) U.S. Cl.
CPC ..... *H10D 89/611* (2025.01); *H03K 17/08122* (2013.01); *H10D 8/25* (2025.01); *H03K 2217/0081* (2013.01)

(58) Field of Classification Search
CPC ........ H10D 89/611; H10D 8/25; H10D 84/00; H10D 84/038; H03K 17/08122;
(Continued)

(56) References Cited

U.S. PATENT DOCUMENTS

2002/0000609 A1    1/2002  Yasuda
2014/0015005 A1*   1/2014  Ishii ..................... H10D 84/403
                                                    257/296

FOREIGN PATENT DOCUMENTS

JP        2002-016254 A    1/2002
JP        2016009774 A  *  1/2016

OTHER PUBLICATIONS

International Search Report issued in PCT/JP2021/006252; mailed May 25, 2021.

* cited by examiner

*Primary Examiner* — William B Partridge
*Assistant Examiner* — Chevy J Boegel
(74) *Attorney, Agent, or Firm* — Studebaker Brackett PLLC

(57) ABSTRACT

Provided is a semiconductor device that enables reliable screening to be performed in a short amount of time. The semiconductor device includes a switching element, a control circuit, a Zener diode, a first terminal, and a second terminal. The switching element, the control circuit, and the Zener diode are formed in the semiconductor substrate. The control circuit controls the state of the switching element. The Zener diode includes a cathode connected to the power supply voltage line between the input terminal where the power supply voltage for driving the control circuit is inputted and the control circuit. The first terminal is provided on a main surface of the semiconductor substrate as an anode of the Zener diode. The second terminal is provided on the main surface as one of the emitter and the source of the switching element, and is insulated from the first terminal within the semiconductor substrate.

18 Claims, 16 Drawing Sheets

103

(58) Field of Classification Search
CPC ..... H03K 17/08128; H03K 2217/0081; G01R
31/2884
See application file for complete search history.

F I G. 2
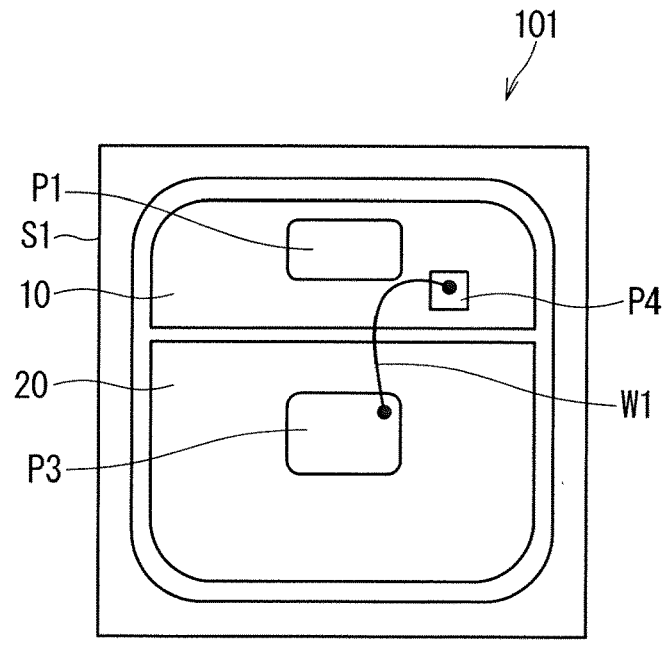
F I G. 3
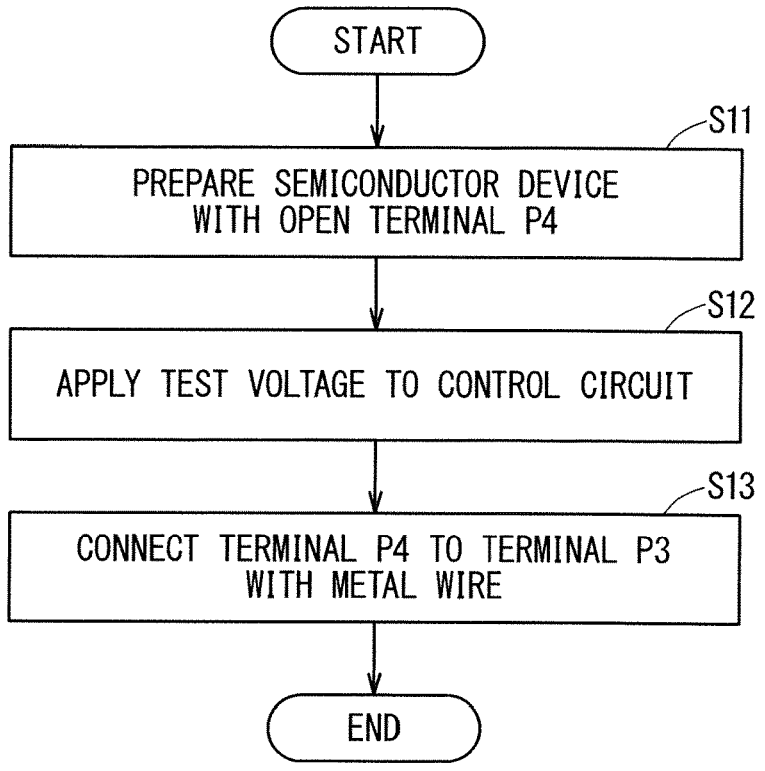

FIG. 4

F I G. 6
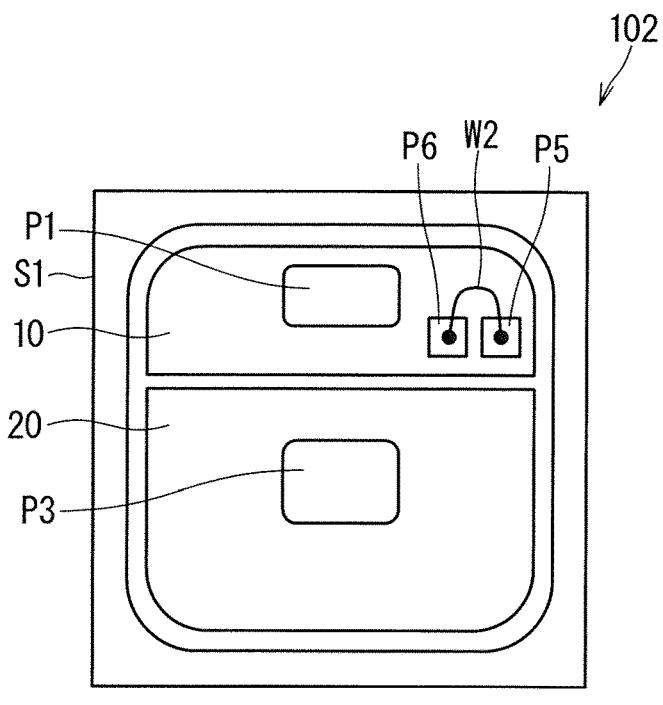
F I G. 7
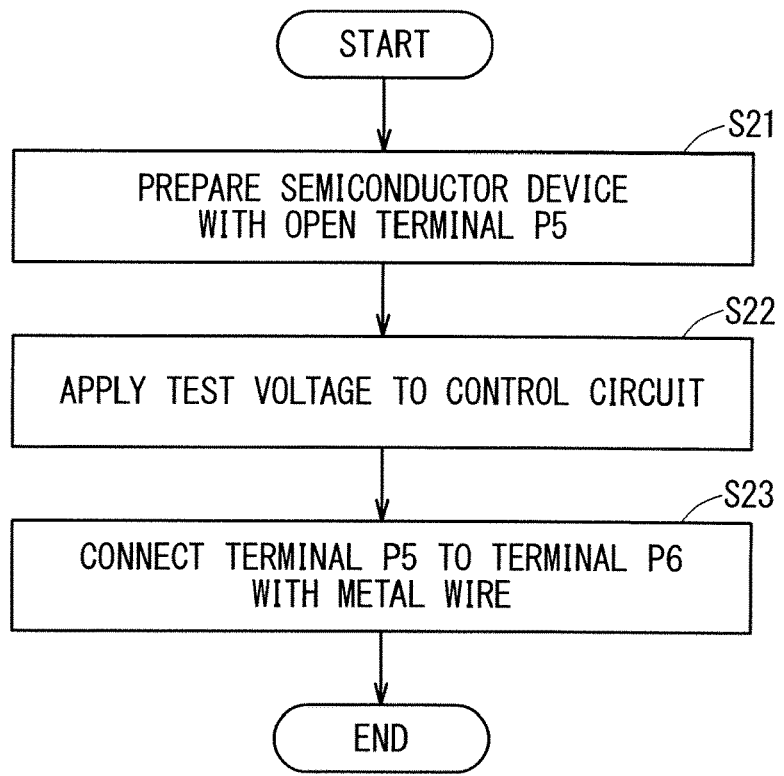

F I G. 1 0
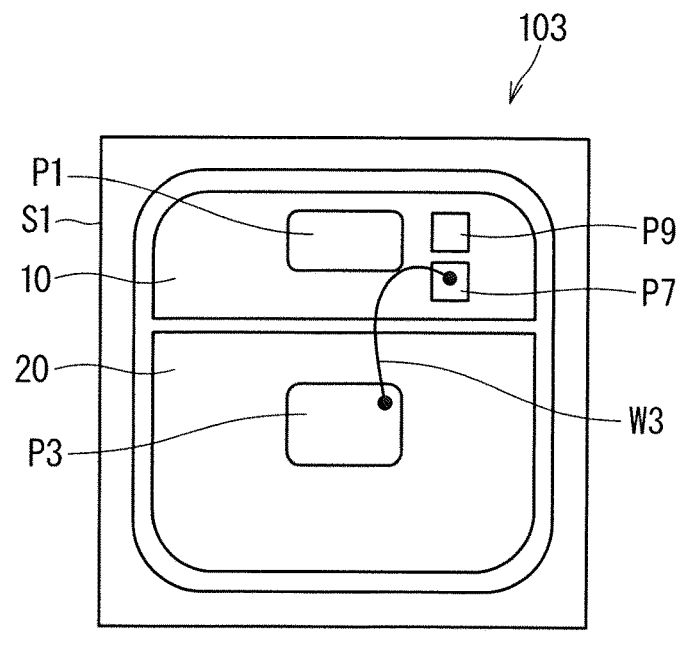
F I G. 1 1
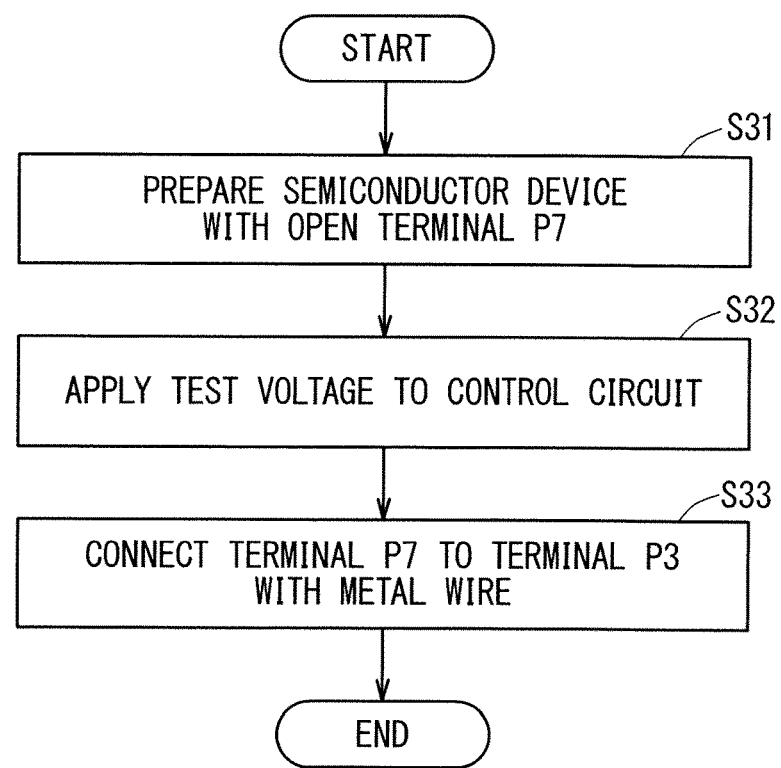

F I G. 1 3
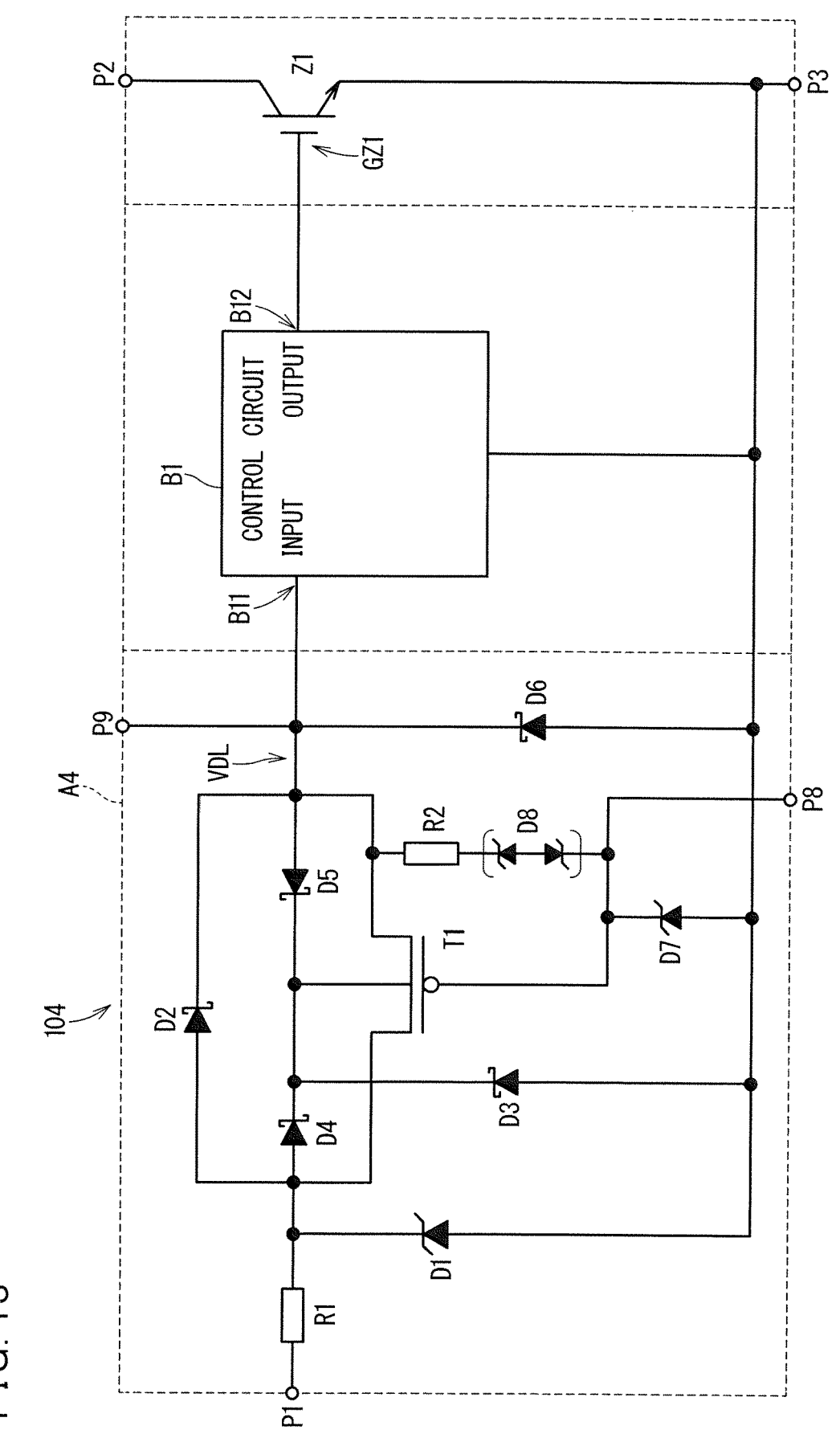

F I G. 1 4
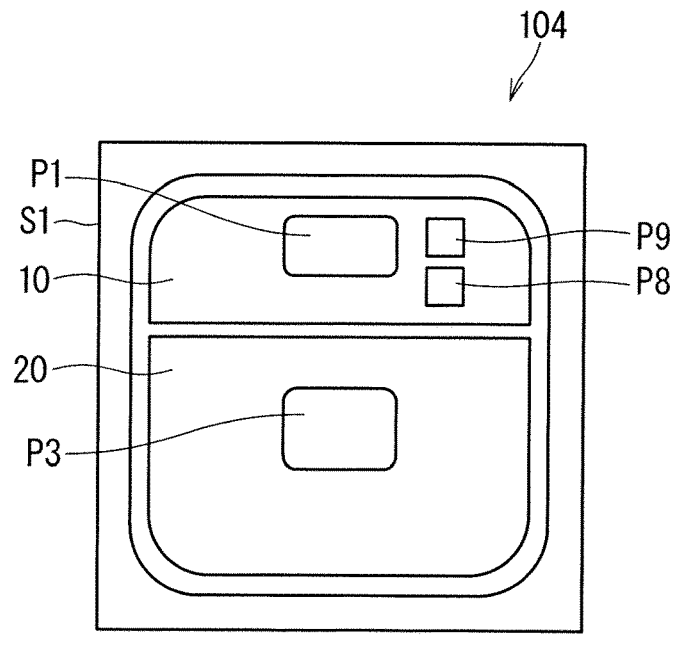
F I G. 1 5
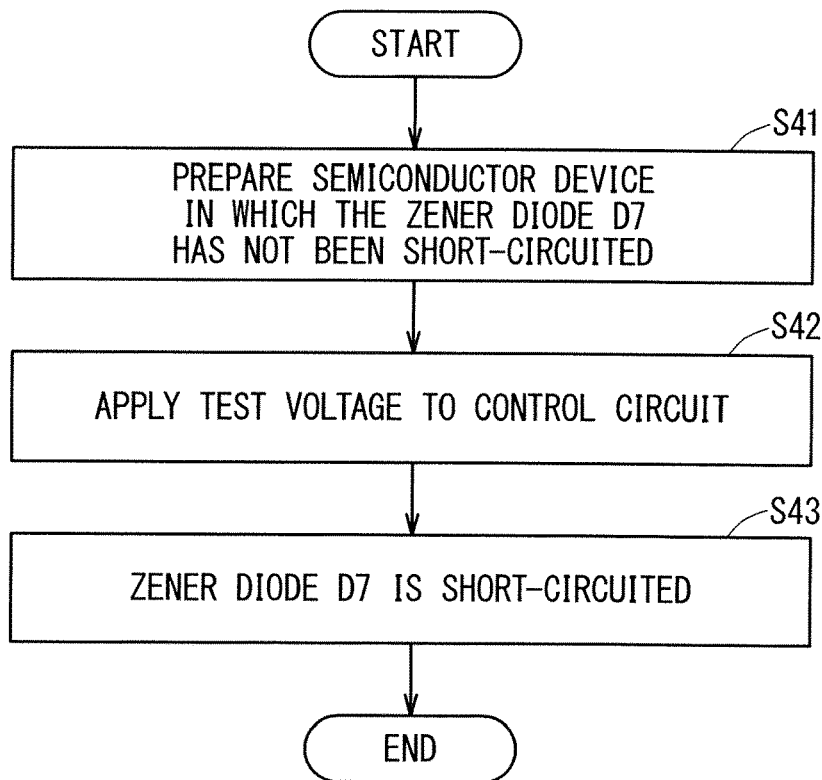

F I G. 17
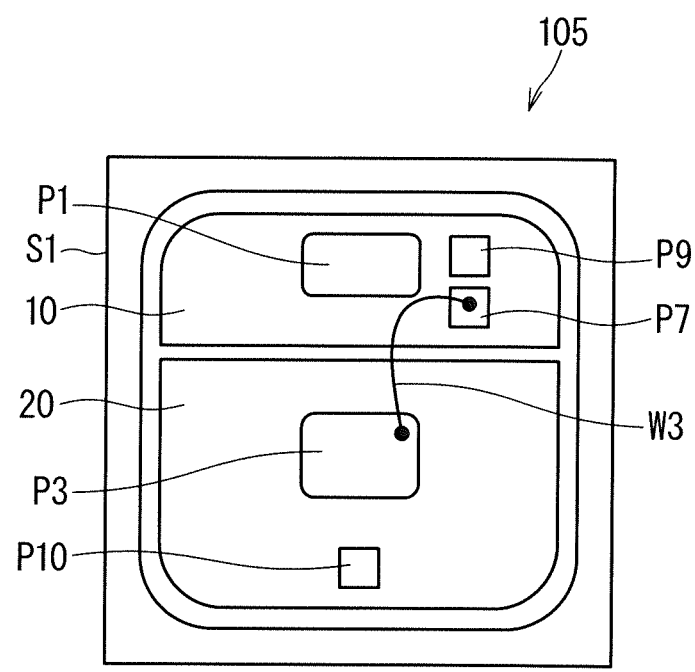

F I G. 1 8
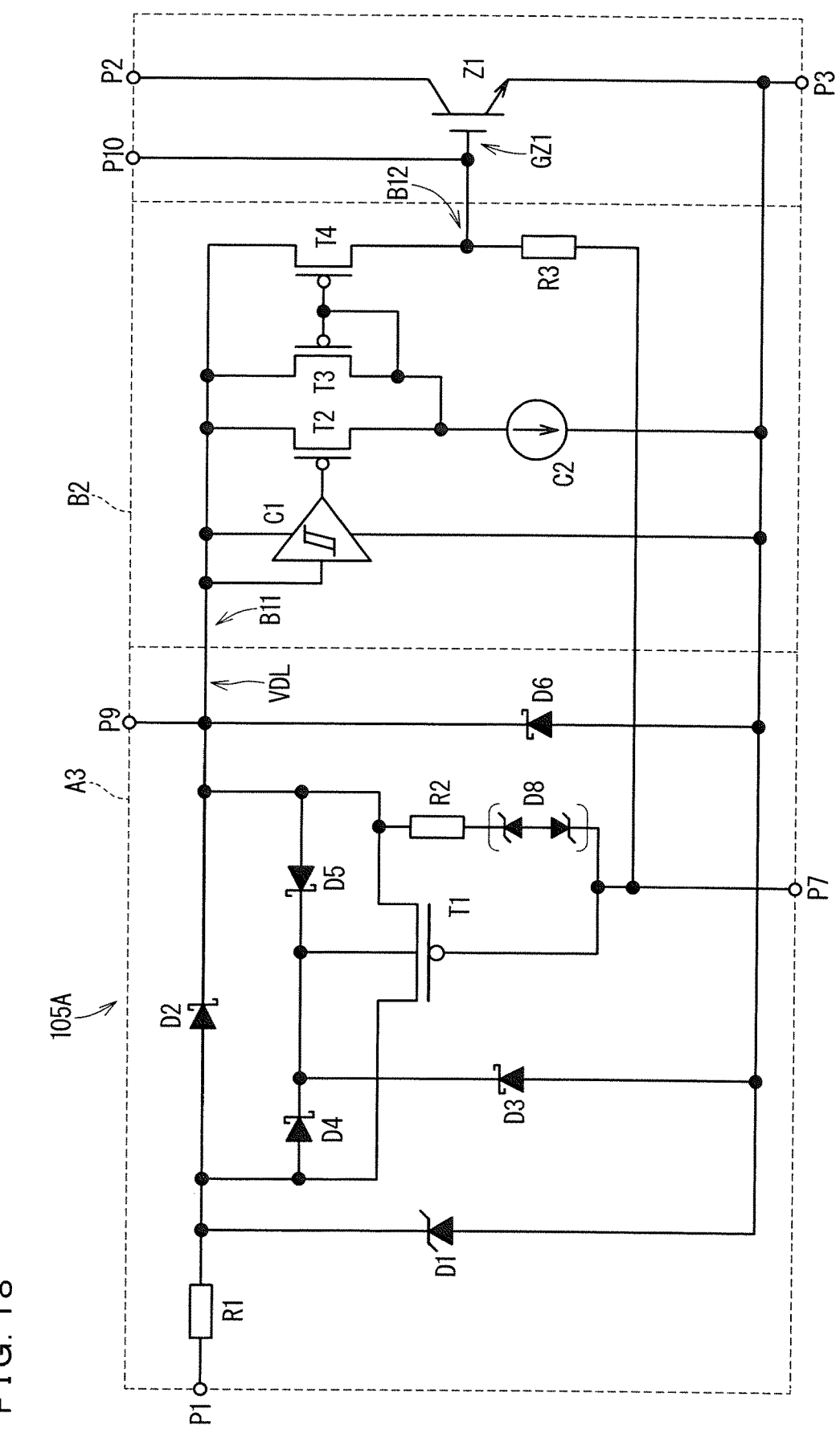

F I G. 1 9
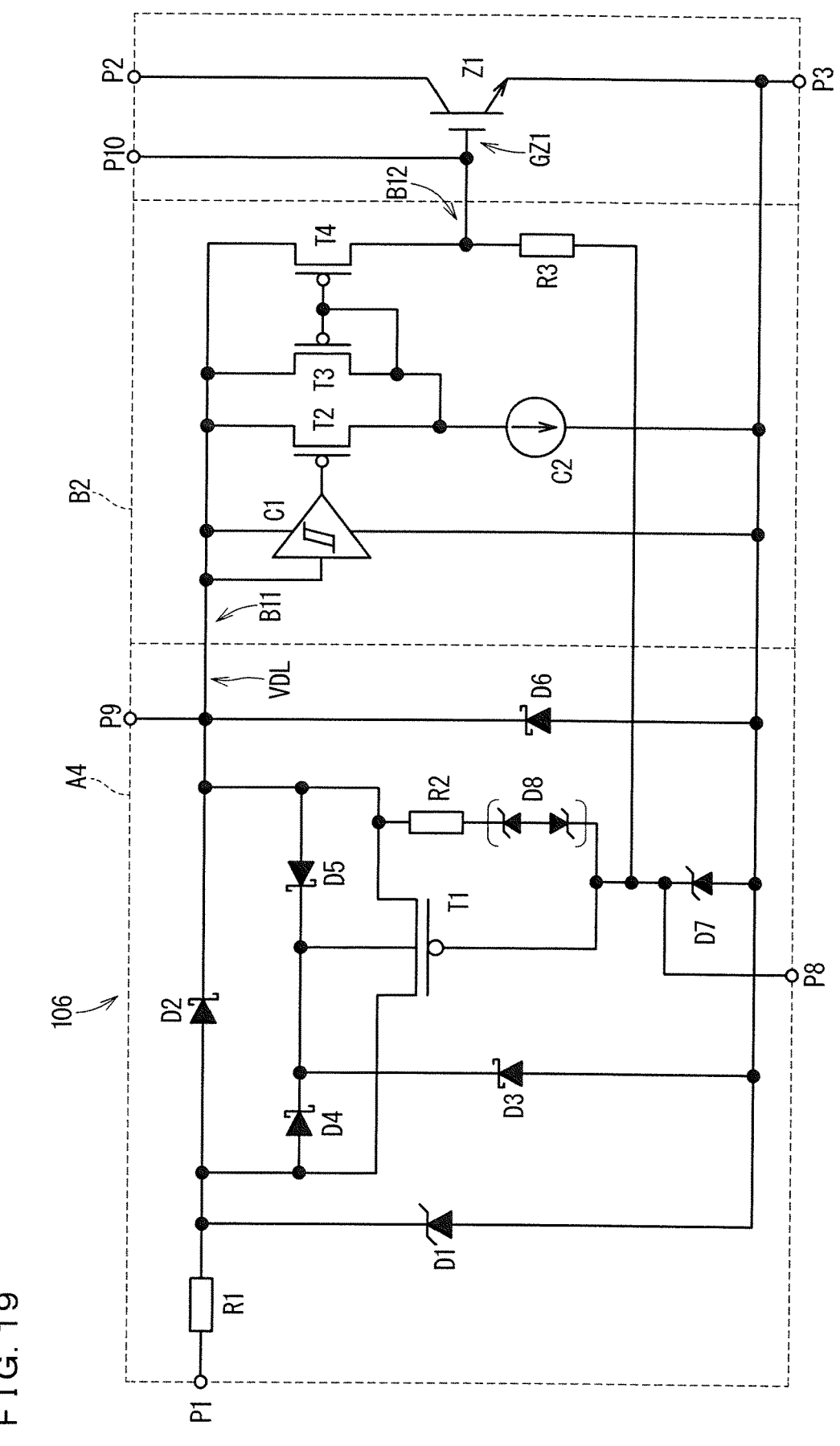

SEMICONDUCTOR DEVICE ENABLING QUICK AND RELIABLE SCREENING

TECHNICAL FIELD

The present disclosure relates to a semiconductor device and a method of manufacturing a semiconductor device.

BACKGROUND ART

A semiconductor device has been known in which a control circuit for controlling the state of the switching elements, such as Insulated Gate Bipolar Transistors (IG-BTs) and Metal-Oxide-Semiconductor Field-Effect Transistors (MOSFETs), is placed on the same substrate as the semiconductor substrate on which the switching elements are formed. (See Patent Document 1, for example). A Zener diode is connected to the input side of the control circuit, and the Zener diode controls voltage applied to the control circuit so that an excessive power supply voltage is not applied to the control circuit. Further, in order to prevent latch-up caused by parasitic elements inside the semiconductor device, a Schottky barrier diode is arranged on the input side of the control circuit in some cases. In a case where a Schottky barrier diode is provided, a P-channel MOSFET is connected in parallel with the Schottky barrier diode to reduce the voltage drop caused by the Schottky barrier diode per se.

PRIOR ART DOCUMENTS

Patent Document(s)

[Patent Document 1] Japanese Patent Application Laid-Open. No. 2002-16254

SUMMARY

Problem to be Solved by the Invention

When a circuit for input protection that includes a Zener diode is provided on the input side of the control circuit, even if a voltage near the rated voltage of the control circuit is applied, a voltage equal to or higher than the breakdown voltage (Zener voltage) of the Zener diode will not be applied to the control circuit. In other words, during burn-in (electrical current test) aimed at screening the control circuit, it is not possible to apply a voltage near the rated voltage to the control circuit. To perform reliable screening, measures such as applying voltage lower than the rated voltage for a long amount of time are necessary, resulting in longer test times.

The present disclosure provides a semiconductor device that enables reliable screening to be performed in a short amount of time, thereby solving the above-mentioned problem.

Means to Solve the Problem

The semiconductor device according to the present disclosure includes a switching element, a control circuit, a Zener diode, a first terminal, and a second terminal. The switching element is formed in the semiconductor substrate. The control circuit is formed in the semiconductor substrate including the switching element and controls the state of the switching element. The Zener diode includes a cathode connected to a power supply voltage line between the input terminal to which the power supply voltage for driving the control circuit is inputted and the control circuit. The Zener diode is formed in the semiconductor substrate. The first terminal is provided on a main surface of the semiconductor substrate as an anode of the Zener diode. The second terminal is provided on the main surface of the semiconductor substrate as one of an emitter and a source of the switching element, and is insulated from the first terminal within the semiconductor substrate.

Effects of the Invention

The semiconductor device of the present disclosure enables reliable screening in a short amount of time.

The objects, features, aspects, and advantages of the present disclosure will become more apparent from the following detailed description and the accompanying drawings.

BRIEF DESCRIPTION OF DRAWINGS

FIG. 2 A plan view illustrating the configuration of the semiconductor device on an upper surface thereof according to the first embodiment.

FIG. 3 A flowchart illustrating a method of manufacturing the semiconductor device according to the first embodiment.

FIG. 4 A circuit diagram illustrating a configuration of the semiconductor device with an open terminal.

FIG. 7 A flowchart illustrating a method of manufacturing the semiconductor device according to the second embodiment.

FIG. 10 A plan view illustrating the configuration of the semiconductor device on an upper surface thereof according to the third embodiment.

FIG. 11 A flowchart illustrating a method of manufacturing the semiconductor device according to the third embodiment.

FIG. 13 A circuit diagram illustrating a configuration of a semiconductor device according to a fourth embodiment.

FIG. 14 A plan view illustrating the configuration of the semiconductor device on an upper surface thereof according to the fourth embodiment.

FIG. 15 A flowchart illustrating a method of manufacturing the semiconductor device according to the fourth embodiment.

FIG. 17 A plan view illustrating the configuration of the semiconductor device on an upper surface thereof according to the fifth embodiment.

FIG. 18 A circuit diagram illustrating a configuration of the semiconductor device with an open terminal.

FIG. 19 A circuit diagram illustrating a configuration of a semiconductor device according to a sixth embodiment.

DESCRIPTION OF EMBODIMENT(S)

First Embodiment (Configuration of Semiconductor Device)

Figure 1:
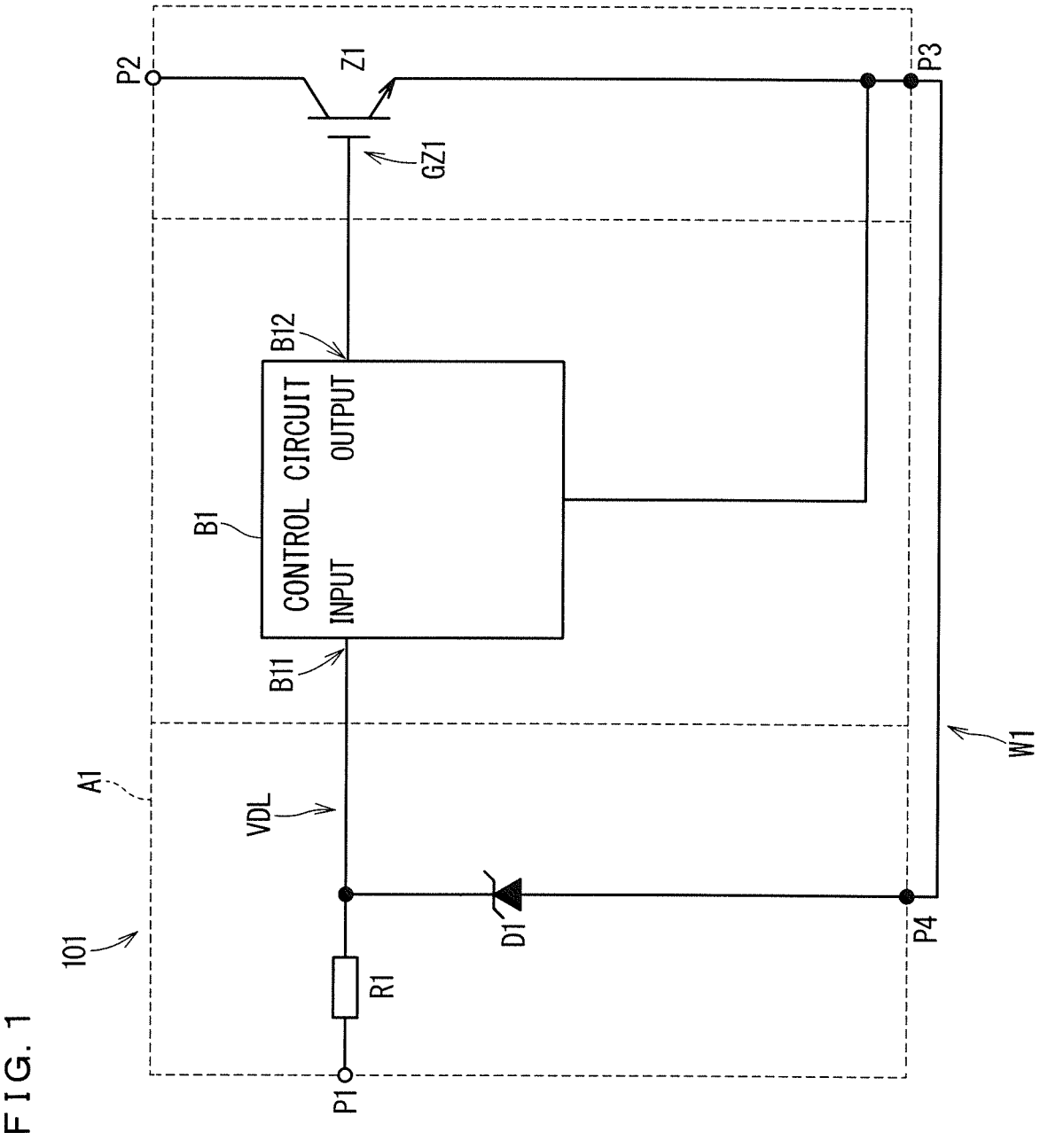
FIG. 1 A circuit diagram illustrating a configuration of a semiconductor device according to a first embodiment.

FIG. 1 is a circuit diagram illustrating a configuration of a semiconductor device 101 according to a first embodiment. FIG. 2 is a plan view illustrating the configuration of the semiconductor device 101 on an upper surface thereof according to the first embodiment.

The semiconductor device 101 includes a protection circuit A1, a control circuit B1, a switching element Z1, an input terminal P1, a terminal P2, a terminal P3, a terminal P4, and a metal wire W1 formed in one semiconductor substrate S1. The protection circuit A1 and the control circuit B1 may be defined as one control circuit with a protection function.

The protection circuit A1 and the control circuit B1 are formed in a circuit region 10 within the semiconductor substrate S1, and the switching element Z1 is formed in a switching element region 20 within the same semiconductor substrate S1. Although only one switching element Z1 is illustrated in FIG. 1, a plurality of switching elements are formed in the switching element region 20. The semiconductor substrate S1 is made of, for example, a semiconductor such as S1, or so-called wide bandgap semiconductors such as SiC, GaN, or gallium oxide.

The protection circuit A1 includes a power supply voltage line VDL, a resistor R1, a Zener diode D1, and the terminal P4.

The power supply voltage line VDL connects the input terminal P1 and the control circuit B1. Hereinafter, "connection" refers to the state where two parts are electrically connected to each other when the semiconductor device 101 operates normally. A signal input from the input terminal P1 serves both as a power supply voltage for driving the control circuit B1 and as a pulse signal for controlling the state of the switching element Z1.

The resistor R1 is provided on the power supply voltage line VDL to limit an unintended current in design, such as a rush current.

The cathode of the Zener diode D1 is connected to the power supply voltage line VDL.

The terminal P4 is the anode of the Zener diode D1 and is provided on the upper surface of the semiconductor substrate S1. Here, the terminal P4 is a metal pad.

The control circuit B1 controls switching of the switching element Z1 between the ON state and the OFF state. An input B11 of the control circuit B1 is connected to the power supply voltage line VDL. An output B12 of the control circuit B1 is connected to a gate GZ1 of the switching element Z1. The control circuit B1 is also connected to the terminal P3.

The switching element Z1 is, for example, an Insulated Gate Bipolar Transistor (IGBT), a Metal Oxide Semiconductor Field Effect Transistor (MOSFET), or the like. The switching element Z1 in FIG. 1 is an N-channel IGBT.

The terminal P2 is a collector electrode and is formed, for example, on the lower surface of the semiconductor substrate S1.

The terminal P3 is an emitter electrode and is the metal pad provided on the upper surface of the semiconductor substrate S1. The terminal P3 is arranged separately from the terminal P4 on the upper surface of the semiconductor substrate S1. The terminal P3 is not short-circuited to the terminal P4 within the semiconductor substrate S1, that is, is insulated from the terminal P4.

The metal wire W1 connects the terminal P3 and the terminal P4. A metal wire W1 is external wiring. The external wiring is wiring that is not provided on the semiconductor substrate S1. Although the terminal P4 is not short-circuited to the terminal P3 within the semiconductor substrate S1, the terminal P3 and the terminal P4 are electrically connected to each other with the metal wire W1.

When the semiconductor device 101 is mounted in a system or the like, the terminal P3 is connected to the GND. That is, the terminal P4 and the control circuit B1 are connected to the GND via the terminal P3. The Zener diode D1 controls the power supply voltage applied to the control circuit B1 to be equal to or lower than the Zener voltage.

(Method of Manufacturing Semiconductor Device)

Figure 4:
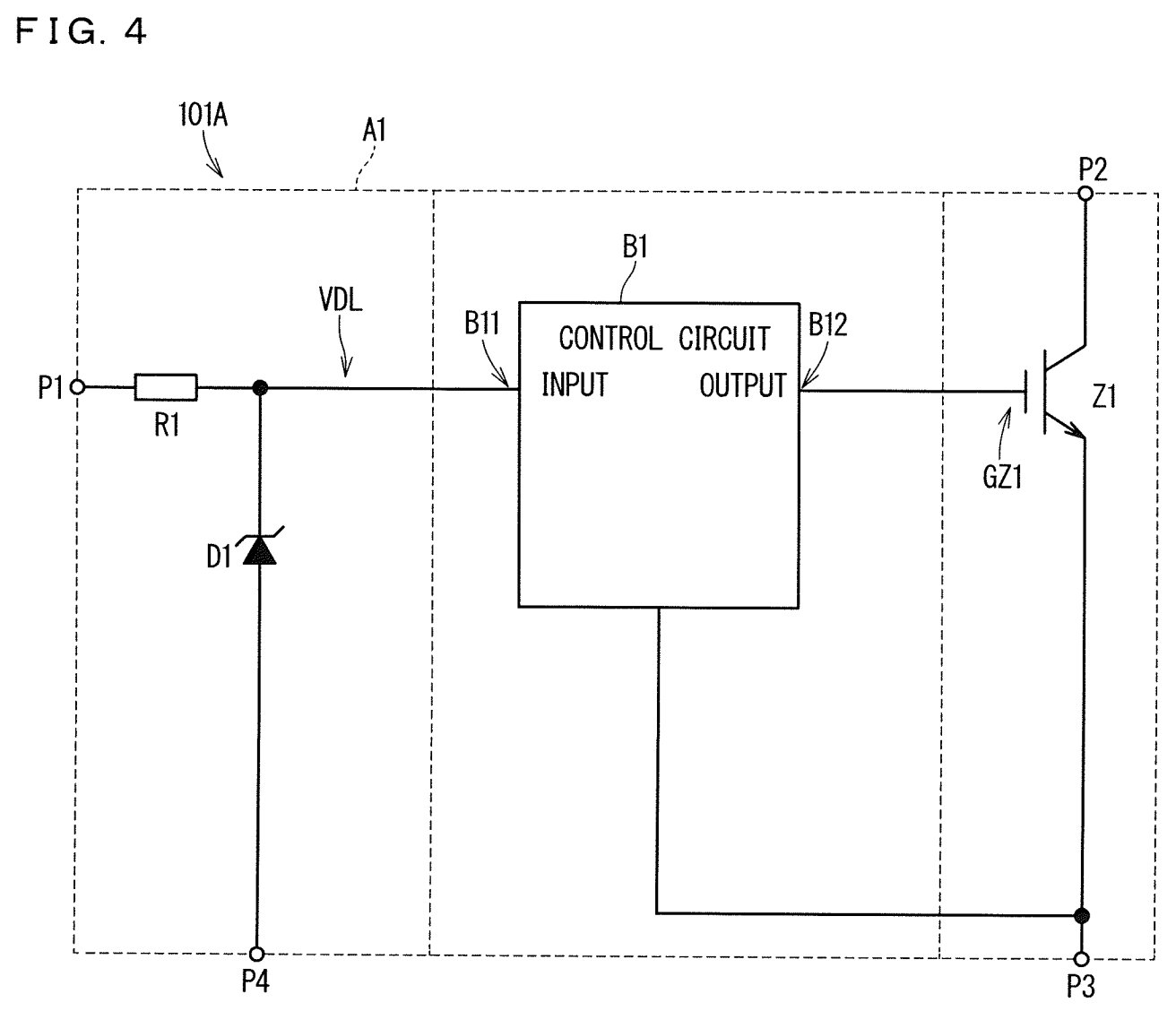

FIG. 3 is a flowchart illustrating a method of manufacturing the semiconductor device 101 according to the first embodiment. FIG. 4 is a circuit diagram illustrating a configuration of a semiconductor device 101A with an open terminal.

In Step S11, the semiconductor device 101A with an open terminal P4 is prepared. In the state before burn-in (electrical current test), in other words, in the initial state, the terminal P4 is not connected to the terminal P3 with the metal wire W1. In addition, the semiconductor device 101A in Step S11 may be in a form of a chip or in a form of a wafer before dicing.

At Step S12, a test voltage is applied to the control circuit B1. This Step S12 is a so-called burn-in. For example, the test voltage is applied to the control circuit B1 by applying thereof between the power supply voltage line VDL and the terminal P3 via the input terminal P1. Also, for example, the test voltage is applied to the control circuit B4 by applying thereof between the power supply voltage line VDL and the terminal P3 via the terminal P4. The test voltage is higher than the Zener voltage of the Zener diode D1 and less than or equal to the rated voltage of the control circuit B1. The test voltage does not short-circuit the terminals P4 and P3. Through this burn-in, the semiconductor device 101A that meets the specifications is screened. Additionally, when the basic characteristic evaluation of the control circuit B1 is performed in conjunction with this test, the terminal P4 is temporarily connected to the terminal P3 with a tester or the like. Then, the power supply voltage is applied to the control circuit B1 by applying thereof between the power supply voltage line VDL and the terminal P3 via the input terminal P1.

At Step S13, after burn-in, the terminal P4 is connected to the terminal P3 with the metal wire W1. The Step S13 is a so-called a wire bonding step. Through this step, the semiconductor device 101 illustrated in FIG. 1 is completed.

To summarize, in the first embodiment, the semiconductor device 101 includes the switching element Z1, the control circuit B1, the Zener diode D1, the terminal P4 (first terminal), the terminal P3 (second terminal), and the metal wire W1 (external wiring). The switching element Z1 is formed in the semiconductor substrate S1. The control circuit B1 is formed in the semiconductor substrate S1 including the switching element Z1 and controls the state of the switching element Z1. The Zener diode D1 includes a cathode connected to the power supply voltage line VDL between the input terminal P1 where the power supply voltage for driving the control circuit B1 is inputted and the control circuit B1. The Zener diode D1 is formed in the semiconductor substrate S1. The terminal P4 is provided on the upper surface (main surface) of the semiconductor substrate S1 as the anode of the Zener diode D1. The terminal P3 is provided on the upper surface of the semiconductor substrate S1 as the emitter of the switching element Z1. The terminal P3 is insulated from the terminal P4 within the semiconductor substrate S1. The metal wire W1 connects the terminal P3 and the terminal P4.

In such a semiconductor device 101, a test voltage equal to or higher than the Zener voltage (approximately 7 V) of the Zener diode D1 can be applied to the control circuit B1 in the manufacturing process. For example, burn-in can be performed by applying a voltage near the rated voltage of the control circuit B1. As a result, reliable screening is completed in a short amount of time.

The switching element Z1 is not limited to N-channel IGBTs. The switching element Z1 may also be an N-channel MOSFET. The terminal P4 then corresponds to the source of the N-channel MOSFET. Also, a switching element in which only the emitter is separated may be connected for current sensing. External wiring is not limited to metal wires. A flat conductor may be adopted as the external wiring. The terminals P4 and the terminal P3 may be provided on the lower surface of the semiconductor substrate S1. In that case, the external wiring may adopt a wiring pattern provided on a circuit board facing the lower surface of the semiconductor substrate S1. These modifications are also applicable to each embodiment illustrated below.

Second Embodiment

Next, a semiconductor device and a method of manufacturing the semiconductor device according to a second embodiment will be described. In the second embodiment, the same reference numerals are given to the same components as in the first embodiment, and detailed description thereof will be omitted.
(Configuration of Semiconductor Device)

Figure 5:
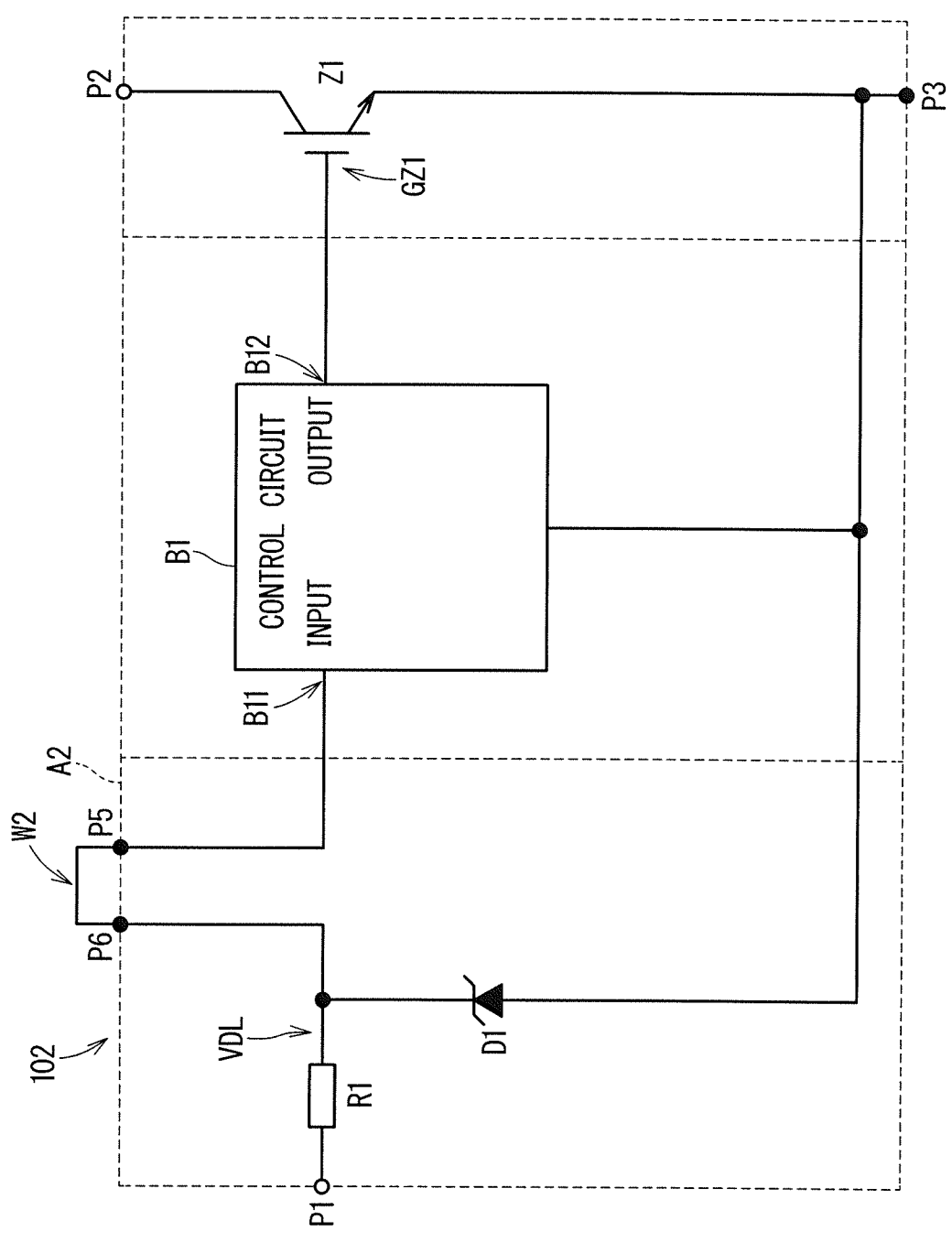
FIG. 5 A circuit diagram illustrating a configuration of a semiconductor device according to a second embodiment, FIG. 6 A plan view illustrating the configuration of the semiconductor device on an upper surface thereof according to the second embodiment.

FIG. 5 is a circuit diagram illustrating a configuration of a semiconductor device 102 according to the second embodiment. FIG. 6 is a plan view illustrating the configuration of the semiconductor device 102 on an upper surface thereof according to the second embodiment.

The semiconductor device 102 includes a protection circuit A2, a control circuit B1, a switching element Z1, an input terminal P1, a terminal P2, a terminal P3, a terminal P5, a terminal P6, and a metal wire W2 formed in one semiconductor substrate S1.

The protection circuit A2 includes a power supply voltage line VDL, a resistor R1, a Zener diode D1, the terminal P5, and the terminal P6.

The cathode of the Zener diode D1 is connected to the power supply voltage line VDL. The anode of the Zener diode D1 is connected to the terminal P3, which is the emitter electrode of the switching element Z1.

The terminal P5 separates the power supply voltage line VDL within the semiconductor substrate S1 between the cathode of the Zener diode D1 and the control circuit B1. The terminal P5 is provided on the upper surface of the semiconductor substrate S1 and connected to an input B11 of the control circuit B1. Here, the terminal P5 is a metal pad.

The terminal P6 is the cathode of the Zener diode D1 and is provided on the upper surface of the semiconductor substrate S1. The terminal P6 is not short-circuited to the terminal P5 within the semiconductor substrate S1, that is, is insulated from the terminal P5. The terminal P6, together with the terminal P5, separates the power supply voltage line VDL within the semiconductor substrate S1 between the cathode of the Zener diode D1 and the control circuit B1. Here, the terminal P6 is a metal pad.

The metal wire W2 connects the terminal P5 and the terminal P6 to form the power supply voltage line VDL. Although the terminal P6 is not short-circuited to the terminal P5 within the semiconductor substrate S1, the terminal P5 and the terminal P6 are electrically connected to each other with the metal wire W2.

When the semiconductor device 102 is mounted in a system or the like, the terminal P3 is connected to the GND. That is, the anode of the Zener diode D1 is connected to the GND via the terminal P3. The Zener diode D1 controls the power supply voltage applied to the control circuit B1 to be equal to or lower than the Zener voltage.
(Method of Manufacturing Semiconductor Device)

Figure 8:
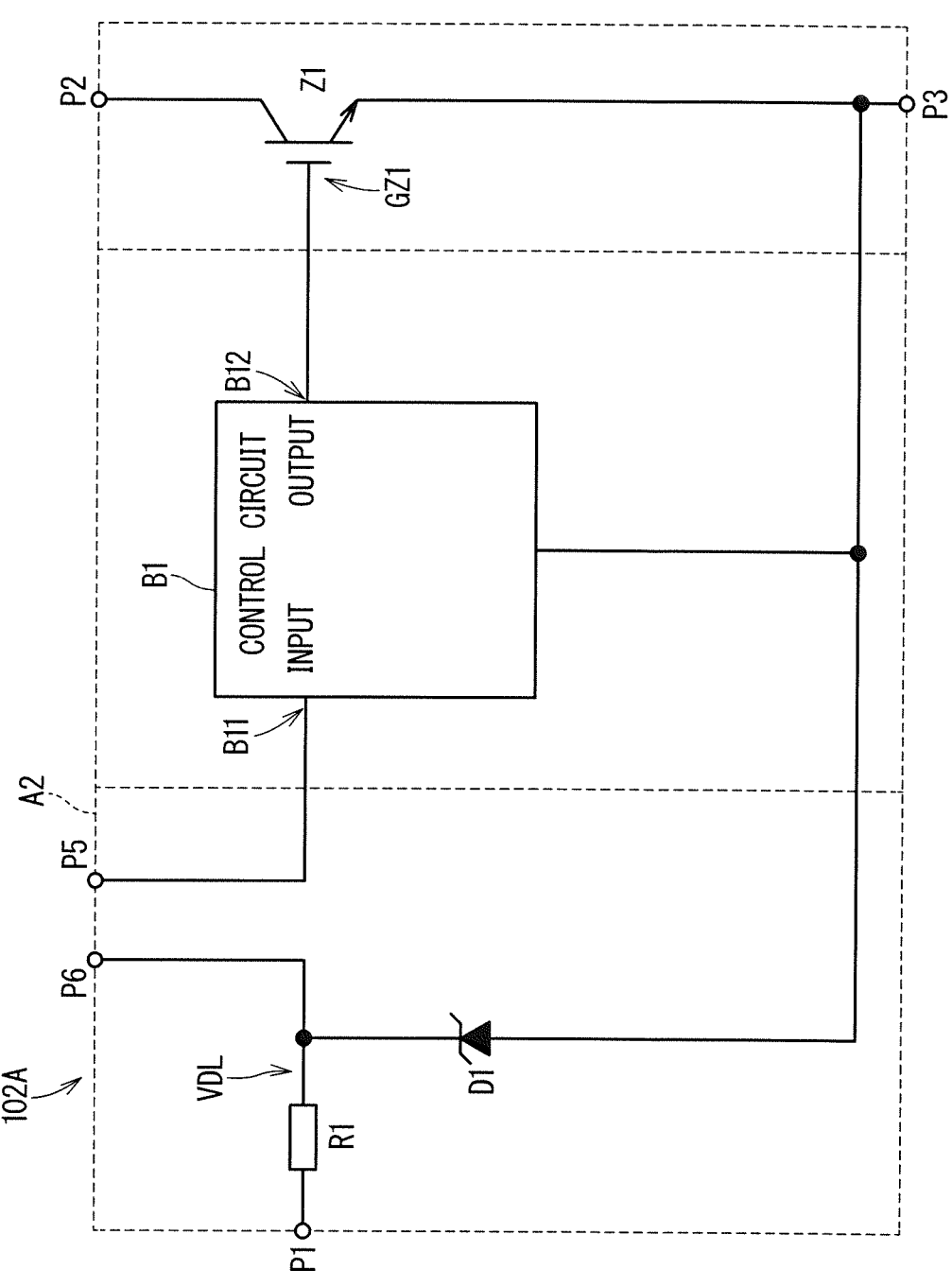
FIG. 8 A circuit diagram illustrating a configuration of the semiconductor device with an open terminal.

FIG. 7 is a flowchart illustrating a method of manufacturing the semiconductor device 102 according to the second embodiment. FIG. 8 is a circuit diagram illustrating a configuration of the semiconductor device 102A with an open terminal.

In Step S21, the semiconductor device 102A with an open terminal P5 is prepared. The terminal P5 being open corresponds to the power supply voltage line VDL being open. In the state before burn-in, the terminal P5 is not connected to the terminal P6 with the metal wire W2.

At Step S22, a test voltage is applied to the control circuit BL. Specifically, the test voltage is applied to the control circuit B1 by applying thereof between the power supply voltage line VDL and the terminal P3 via the terminal P5. The test voltage is higher than the Zener voltage of the Zener diode D1 and less than or equal to the rated voltage of the control circuit B1. Through this burn-in, the semiconductor device 102A that meets the specifications is screened.

At Step S23, after burn-in, the terminal P5 is connected to the terminal P6 with the metal wire W2. Through this step, the semiconductor device 102 illustrated in FIG. 5 is completed.

To summarize, in the second embodiment, the semiconductor device 102 includes the switching element Z1, the control circuit B1, the Zener diode D1, the terminal P5 (first terminal), the terminal P6 (second terminal), and the metal wire W2 (external wiring). The switching element Z1 is formed in the semiconductor substrate S1. The control circuit B1 is formed in the semiconductor substrate S1 including the switching element Z1 and controls the state of the switching element Z1. The Zener diode D1 includes a cathode connected to the power supply voltage line VDL between the input terminal P1 where the power supply voltage for driving the control circuit B1 is inputted and the control circuit B1. The Zener diode D1 is formed in the semiconductor substrate S1. The terminal P5 is provided on the upper surface of the semiconductor substrate S1. The terminal P5 separates the power supply voltage line VDL within the semiconductor substrate S1 between the cathode of the Zener diode D1 and the control circuit B1. The terminal P5 is connected to the input B11 of the control circuit B1. The terminal P6 is provided on the upper surface of the semiconductor substrate S1 as the cathode of the Zener diode D1. The terminal P6, together with the terminal P5, separates the power supply voltage line VDL within the semiconductor substrate S1 between the cathode of the Zener diode D1 and the control circuit B1. The metal wire W2 connects the terminal P5 and the terminal P6 to form the power supply voltage line VDL.

In such a semiconductor device 102, a test voltage equal to or higher than the Zener voltage (approximately 7 V) of the Zener diode D1 can be applied to the control circuit B1 in the manufacturing process. For example, burn-in can be performed by applying a voltage near the rated voltage of control circuit B1. As a result, reliable screening is completed in a short amount of time.

Although the terminal P5 is provided in the protection circuit A2 in the second embodiment, the terminal P5 may be the input B11 per se of the control circuit B1.

Third Embodiment

Next, a semiconductor device and a method of manufacturing the semiconductor device according to a third embodiment will be described. In the third embodiment, the same reference numerals are given to the same components as in the first or second embodiment, and detailed description thereof will be omitted.

<Configuration of Semiconductor Device>

Figure 9:
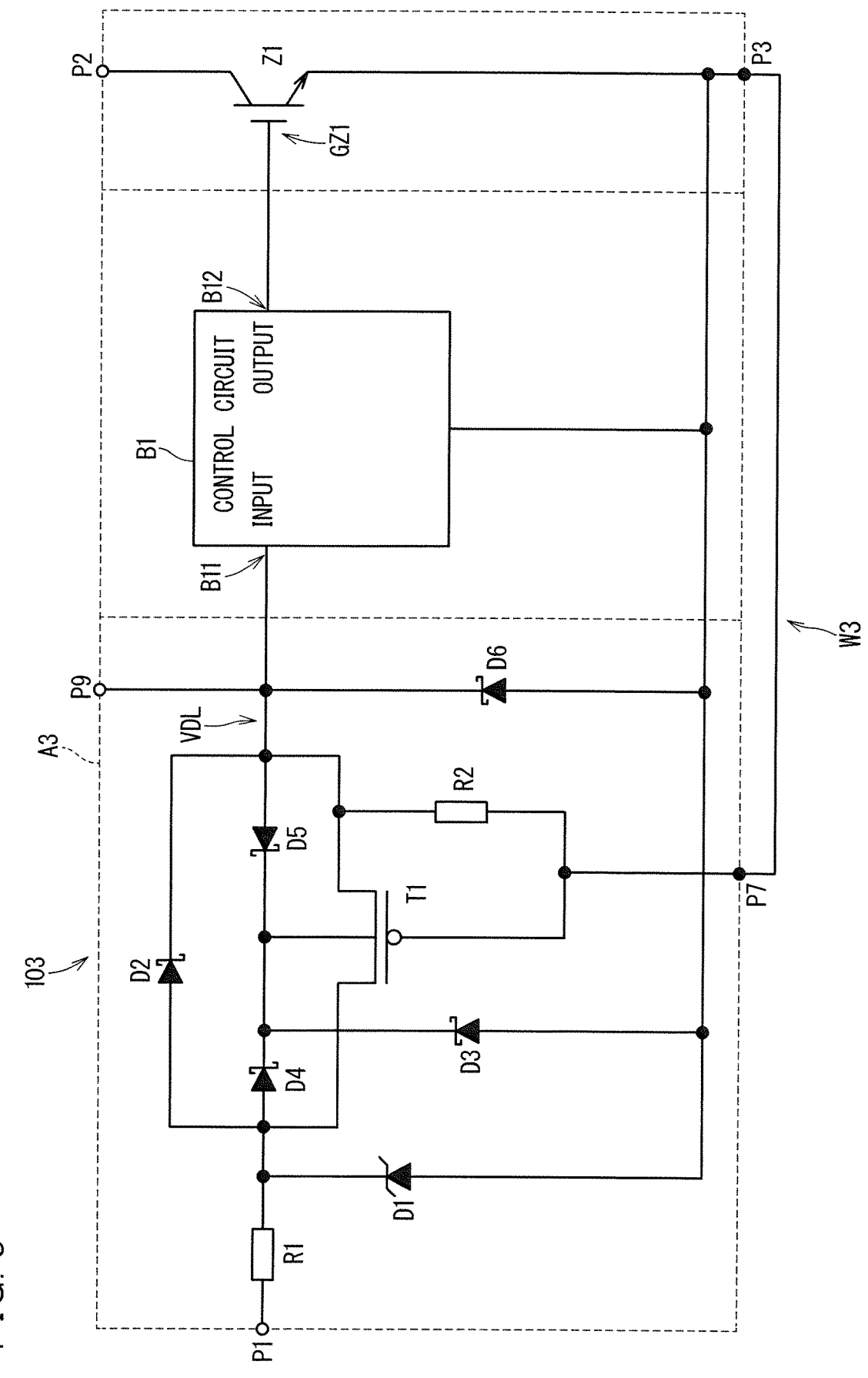
FIG. 9 A circuit diagram illustrating a configuration of a semiconductor device according to a third embodiment.

FIG. 9 is a circuit diagram illustrating a configuration of a semiconductor device 103 according to the third embodiment. FIG. 10 is a plan view illustrating the configuration of the semiconductor device 103 on the upper surface thereof according to the third embodiment.

The semiconductor device 103 includes a protection circuit A3, a control circuit B1, a switching element Z1, an input terminal P1, a terminal P2, a terminal P3, a terminal P7, a terminal P9, and a metal wire W3 formed in one semiconductor substrate S1.

The protection circuit A3 includes an input terminal P1, a resistor R1, a resistor R2, a Zener diode D1, a Schottky barrier diodes D2 to D6, a transistor T1, a terminal P7 and a terminal P9. The configuration of the input terminal P1, the resistor R1 and the Zener diode D1 is the same as those in the second embodiment.

The Schottky barrier diode D2 and the transistor T1 are connected in parallel with the power supply voltage line VDL. The Schottky barrier diode D2 prevents latch-up parasitic on the elements in the circuit. The transistor T1 is a P-channel MOSFET. The transistor T1 reduces the voltage drop across the Schottky barrier diode D2.

The gate of the transistor T1 is connected to the drain via the resistor R2. The back gate of the transistor T1 is connected to the cathodes of the respective Schottky barrier diodes D3 and D4. The anode of Schottky barrier diode D3 is connected to the emitter of the switching element Z1, that is, the terminal P3. The anode of Schottky barrier diode D4 is connected to the input terminal P1 via the cathode of the Zener diode D1 and the resistor R1. The anode of the Schottky barrier diode D5 is connected to the input B11 of the control circuit B1. The cathode of the Schottky barrier diode D6 is connected to the input B11 of the control circuit B1 and the anode thereof is connected to the terminal P3.

The terminal P9 is connected to the power supply voltage line VDL between the drain of the transistor T1 and the input B11 of the control circuit B1. The terminal P9 is provided on the upper surface of the semiconductor substrate S1. Here, the terminal P9 is a metal pad.

The terminal P7 is provided on the upper surface of the semiconductor substrate S1 as the gate of the transistor T1. Here, the terminal P7 is a metal pad.

The terminal P3 is arranged separately from the terminal P7 on the upper surface of the semiconductor substrate S1. The terminal P3 is not short-circuited to the terminal P7 within the semiconductor substrate S1, that is, is insulated from the terminal P7.

The metal wire W3 connects the terminal P3 and the terminal P7. Although the terminal P7 is not short-circuited to the terminal P3 within the semiconductor substrate S1, the terminal P3 and the terminal P7 are electrically connected to each other with the metal wire W3.

When the semiconductor device 103 is mounted in a system or the like, the terminal P3 is connected to the GND. That is, the anode of the Zener diode D1 and the terminal P7 are connected to the GND via the terminal P3. The Zener diode D1 controls the power supply voltage applied to the control circuit B1 to be equal to or lower than the Zener voltage. Also, such a configuration prevents malfunction of the parasitic thyristor in the back gate of the transistor T1 and the control circuit B1.

(Method of Manufacturing Semiconductor Device)

Figure 12:
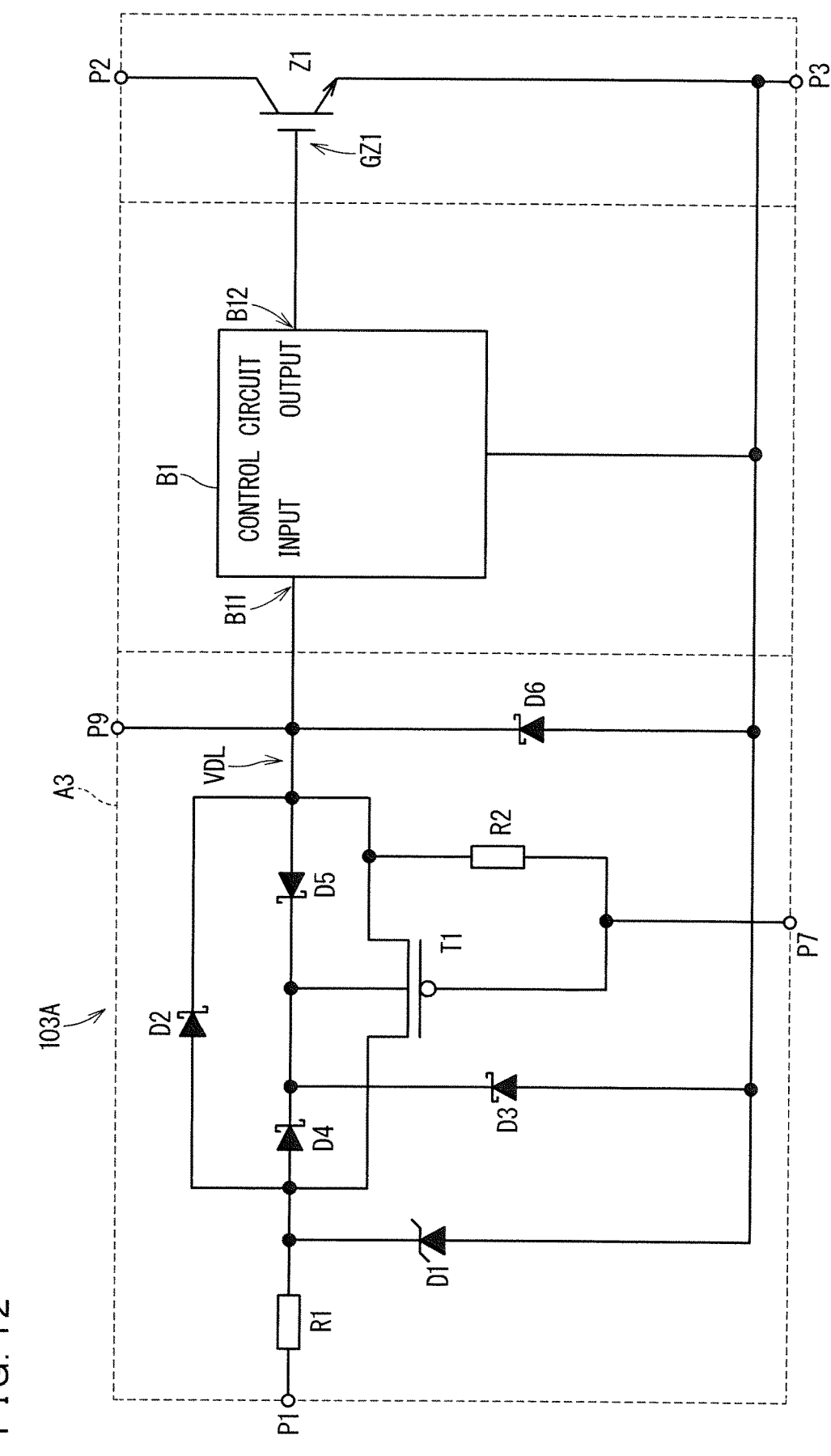
FIG. 12 A circuit diagram illustrating a configuration of the semiconductor device with an open terminal.

FIG. 11 is a flowchart illustrating a method of manufacturing the semiconductor device 103 according to the third embodiment. FIG. 12 is a circuit diagram illustrating a configuration of the semiconductor device 103A with an open terminal.

In Step S31, the semiconductor device 103A with an open terminal P7 is prepared. In the state before burn-in, the terminal P7 is not connected to the terminal P3 with the metal wire W3.

At Step S32, a test voltage is applied to the control circuit B1. For example, with the terminal P7 in an open state, the test voltage is applied to the control circuit B1 by applying thereof between the terminal P9 provided on the power supply voltage line VDL and the terminal P3. The terminal P7, which is the gate of the transistor T1, is not connected to the terminal P3 as described above. The resistor R2 lies between the gate and the drain of the transistor T1. Therefore, when the test voltage is applied between the terminal P9 and the terminal P3, the transistor T1 is not driven. A test voltage, with a maximum value of approximately 16 V being breakdown voltage of the Schottky barrier diode D6, is applied to the control circuit B1. Through this test, the semiconductor device 103A that meets the specifications is screened. For example, the test voltage may be applied to the control circuit B1 by applying thereof between the power supply voltage line VDL and the terminal P3 via the terminal P7.

At Step S33, after burn-in, the terminal P7 is connected to the terminal P3 with the metal wire W3. Through this step, the semiconductor device 103 illustrated in FIG. 9 is completed. The gate of the transistor T1 is connected to the emitter of the switching element Z1, that is, the terminal P3. The transistor T1 reduces the forward voltage drop of the Schottky barrier diode D2.

To summarize, in the third embodiment, the semiconductor device 103 includes the switching element Z1, the control circuit B1, the Zener diode D1, the transistor T1, the resistor R2, the terminal P7 (first terminal), the terminal P3 (second terminal), and the metal wire W3 (external wiring). The switching element Z1 is formed in the semiconductor substrate S1. The control circuit B1 is formed in the semiconductor substrate S1 including the switching element Z1 and controls the state of the switching element Z1. The Zener diode D1 includes a cathode connected to the power supply voltage line VDL between the input terminal P1 where the power supply voltage for driving the control circuit B1 is inputted and the control circuit B1. The Zener diode D1 is formed in the semiconductor substrate S1. The transistor T1 is formed in the semiconductor substrate S1 and connected in parallel with the power supply voltage line VDL. The resistor R2 is formed in the semiconductor substrate S1 and provided between the gate and the drain of the transistor T1. The terminal P7 is provided on the upper surface of the semiconductor substrate S1 as the gate of the transistor T1. The terminal P3 is provided on the upper surface of the semiconductor substrate S1 as the emitter of the switching element Z1, and is insulated from the terminal P7. The metal wire W3 connects the terminal P7 and the terminal P3.

Such a semiconductor device 103 enables burn-in with a voltage near the rated voltage of the control circuit B1 being applied to the control circuit B1 in the manufacturing process. A voltage higher than the Zener voltage of the Zener diode D1 for input protection is applied; therefore, reliable screening is completed in a short amount of time.

Fourth Embodiment

Next, a semiconductor device and a method of manufacturing the semiconductor device according to a fourth embodiment will be described. In the fourth embodiment, the same reference numerals are given to the same components as in the first to third embodiments, and detailed description thereof will be omitted.

<Configuration of Semiconductor Device>

FIG. 13 is a circuit diagram illustrating a configuration of a semiconductor device 104 according to the fourth embodiment. FIG. 14 is a plan view illustrating the configuration of the semiconductor device 104 on the upper surface thereof according to the fourth embodiment.

The semiconductor device 104 includes a protection circuit A4, a control circuit B1, a switching element Z1, an input terminal P1, a terminal P2, a terminal P3, a terminal P8, and a terminal P9 formed in one semiconductor substrate S1.

The protection circuit A4 further includes a Zener diode D7 and a bidirectional Zener diode D8 in addition to the configuration of the protection circuit A3 of the third embodiment.

The Zener diode D7 includes a cathode connected to the gate of the transistor T1 and an anode connected to the emitter of the switching element Z1. The Zener diode D7 has been short-circuited (Zener zapped). That is, the gate of the transistor T1 is short-circuited to the terminal P3.

The bidirectional Zener diode D8 is provided between the gate and the drain of the transistor T1 and connected in series with the resistor R2. In the manufacturing process of the semiconductor device 104, the bidirectional Zener diode D8 reduces heat generation in each element in the current path when the test voltage is applied to the control circuit B1. Overvoltage or overcurrent causes the heat generation, causing damage to each element. The degree of reduction in the heat generation can be adjusted depending on the number of the bidirectional Zener diodes D8 connected. If the heat generation is low, the bidirectional Zener diode D8 is not necessarily required.

The terminal P8 is provided on the upper surface of the semiconductor substrate S1 as the gate of the transistor T1. Here, the terminal P8 is a metal pad. No metal wire or the like is connected to the terminal P8.

The terminal P3 is arranged separately from the terminal P8 on the upper surface of the semiconductor substrate S1. The terminal P3 is not short-circuited to the terminal P8 within the semiconductor substrate S1, that is, is insulated from the terminal P8.

When the semiconductor device 104 is mounted in a system or the like, the anode of the Zener diode D1 is connected to the GND via the terminal P3. The Zener diode D1 controls the power supply voltage applied to the control circuit B1 to be equal to or lower than the Zener voltage. Further, the Zener diode D7 has been short-circuited (Zener zapped), the gate of the transistor T1 is also connected to the GND via the terminal P3. The transistor T1 reduces the forward voltage drop of the Schottky barrier diode D2.

(Method of Manufacturing Semiconductor Device)

FIG. 15 is a flowchart illustrating a method of manufacturing the semiconductor device 104 according to the fourth embodiment.

In Step S41, a semiconductor device in which the Zener diode D7 has not been short-circuited is prepared. In the state before burn-in, the gate of the transistor T1 is insulated from the terminal P3 within a predetermined voltage range by the Zener diode D7.

In Step S42, a test voltage is applied to the control circuit B1. For example, with the terminal P8 in an open state, the test voltage is applied to the control circuit B1 by applying thereof between the terminal P9 and the terminal P3. No current flows from the gate of the transistor T1 to the terminal P3. And the resistor R2 lies between the gate and the drain of transistor T1. Therefore, when the test voltage is applied through the terminal P9, the transistor T1 is not driven. A test voltage, with a maximum value of approximately 16 V being breakdown voltage of the Schottky barrier diode D6, is applied to the control circuit B1. At this point, a voltage of approximately 9 V is applied between the gate and the drain of the transistor T1. Through this test, the semiconductor device that meets the specifications is screened.

In Step S43, after burn-in, the Zener diode D7 is short-circuited (Zener zapped). A voltage of approximately 35 V, for example, is applied between the gate of the transistor T1 and the emitter of the switching element Z1 as a voltage for short-circuiting. At this point, the voltage between the gate and the drain of the transistor T1 is approximately 19 V. A bidirectional Zener diode D8 is connected between the gate and the drain of the transistor T1 so that each element in the current path can withstand the heat generation. By Zener zapping, the gate of the transistor T1 is short-circuited to the emitter of switching element Z1, that is, the terminal P3. The transistor T1 reduces the forward voltage drop of the Schottky barrier diode D2.

To summarize, the semiconductor device 104 in the fourth embodiment includes the switching element Z1, the control circuit B1, the Zener diode D1, the transistor T1, the resistor R2, the Zener diode D7 (Zener diode for short-circuiting), and the terminal P8 (gate terminal). The switching element Z1 is formed in the semiconductor substrate S1. The control circuit B1 is formed in the semiconductor substrate S1 including the switching element Z1 and controls the state of the switching element Z1. The Zener diode D1 includes a cathode connected to the power supply voltage line VDL between the input terminal P1 where the power supply voltage for driving the control circuit B1 is inputted and the control circuit B1. The Zener diode D1 is formed in the semiconductor substrate S1. The transistor T1 is formed in the semiconductor substrate S1 and connected in parallel with the power supply voltage line VDL. The resistor R2 is formed in the semiconductor substrate S1 and provided between the gate and the drain of the transistor T1. The Zener diode D7 includes a cathode connected to the gate of the transistor T1 and an anode connected to the emitter of the switching element Z1. The Zener diode D7 is short-circuited. The terminal P8 is provided on the upper surface of the semiconductor substrate S1 as the gate of the transistor T1.

Such a semiconductor device 104 enables burn-in with a voltage near the rated voltage of the control circuit B1 being applied to the control circuit B1 in the manufacturing process. A voltage higher than the Zener voltage of the Zener diode D1 for input protection is applied; therefore, reliable screening is completed in a short amount of time. A wire bonding process is not required for electrical connection between the gate of the transistor T1 and the emitter of the switching element Z1, resulting in reduced cost.

Fifth Embodiment

A semiconductor device and a method of manufacturing the semiconductor device according to a fifth embodiment will be described. In the fifth embodiment, the same reference numerals are given to the same components as in the first to fourth embodiments, and detailed description thereof will be omitted.

<Configuration of Semiconductor Device>

Figure 16:
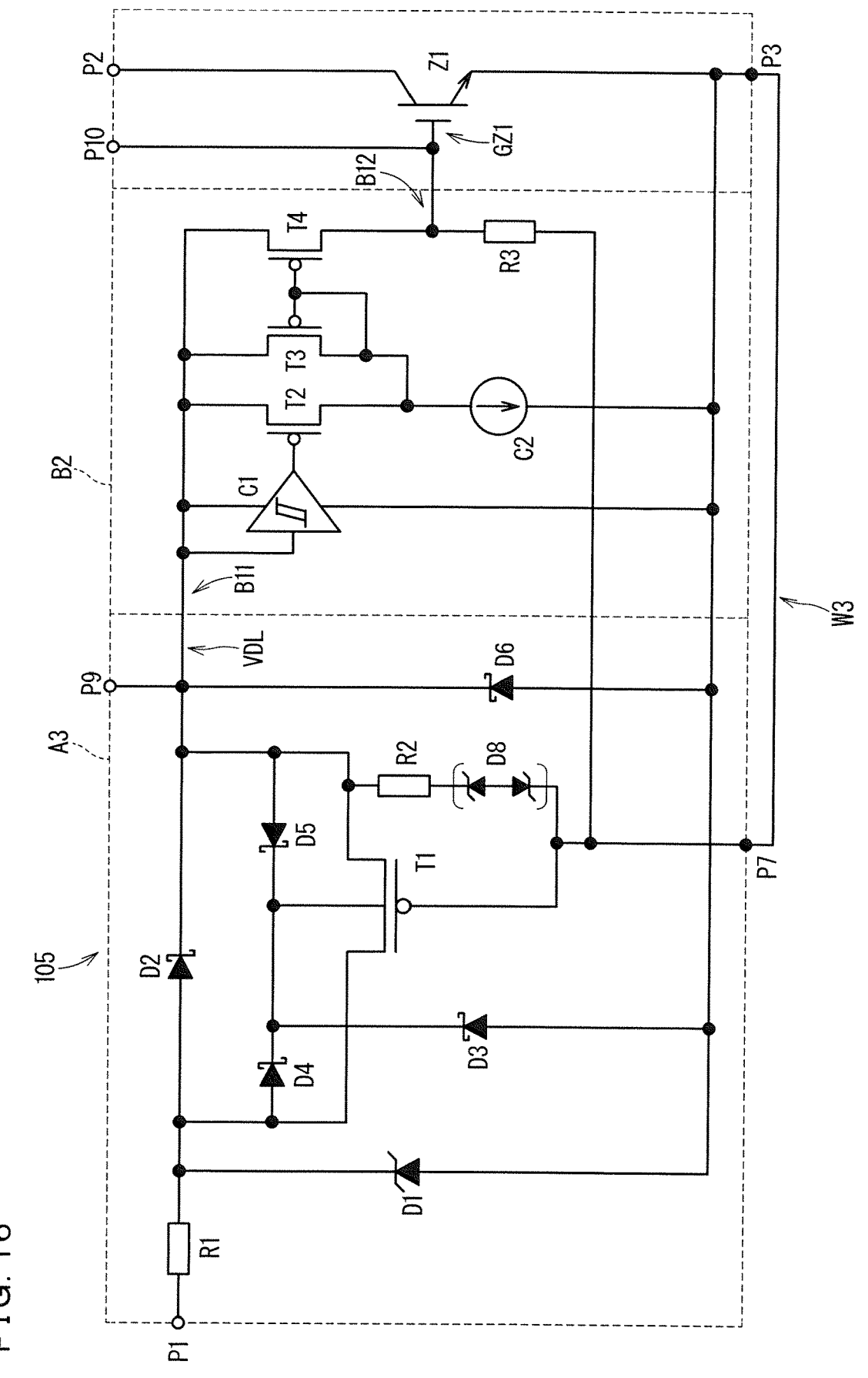
FIG. 16 A circuit diagram illustrating a configuration of a semiconductor device according to a fifth embodiment.

FIG. 16 is a circuit diagram illustrating a configuration of a semiconductor device 105 according to the fifth embodiment. FIG. 17 is a plan view illustrating the configuration of the semiconductor device 105 on the upper surface thereof according to the fifth embodiment.

The semiconductor device 105 includes a protection circuit A3, a control circuit B2, a switching element Z1, an input terminal P1, a terminal P2, a terminal P3, a terminal P7, a terminal P9, a terminal P10, and a metal wire W3 formed in one semiconductor substrate S1.

The control circuit B2 includes a waveform shaping circuit C1, a P-channel MOSFET (12), a P-channel MOSFET (T3), a P-channel MOSFET (T4), a constant current source C2, and a resistor R3.

The P-channel MOSFET (12) is driven by the output of the waveform shaping circuit C1. The source of the P-channel MOSFET (T3) is shared with the drain of the P-channel MOSFET (T2) and connected to the constant current source C2. The gate of the P-channel MOSFET (T4) is shared with the P-channel MOSFET (T3). The P-channel MOSFET (T4) and the P-channel MOSFET (T3) form a current mirror circuit. The drain of the P-channel MOSFET (T4) is connected to the gate GZ1 of the switching element Z1. The resistor R3 connects the gate of the transistor T1, the gate GZ1 of the switching element Z1 and the drain of the P-channel MOSFET (T4) with each other.

The protection circuit A3 has the configuration illustrated in the third embodiment. Although the terminal P7 is not short-circuited to the terminal P3 within the semiconductor substrate S1, the terminal P3 and the terminal P7 are electrically connected to each other with the metal wire W3. As in the fourth embodiment, a bidirectional Zener diode D8 may be connected between the gate of the transistor T1 and the resistor R2, if necessary.

The terminal P10 is provided on the upper surface of the semiconductor substrate S1 as the gate electrode of the switching element Z1. Here, the terminal P10 is a metal pad.

When the semiconductor device 105 is mounted in a system or the like, the anode of the Zener diode D1 and the terminal P7 are connected to the GND via the terminal P3.

(Operation of Semiconductor Device)

(i) A voltage signal is input to the input terminal P1. A power supply voltage is generated based on the voltage signal, and the Zener diode D1 controls the power supply voltage to be below the Zener voltage. (ii) Based on the power supply voltage, the waveform shaping circuit C1 is turned On. An H signal is transmitted to the gate of the P-channel MOSFET (T2), and the P-channel MOSFET (T2)

is turned Off. A current flows from the constant current source C2 to the P-channel MOSFET (T3). The current mirror configuration results in a replicated or amplified current flowing in the P-channel MOSFET (T4). (iii) The current flows through the resistor R3. A gate voltage is applied to the gate GZ1 of the switching element Z1, and a current flows from the terminal P3, which is the emitter electrode, to the terminal P2, which is the collector electrode. In the blocking operation, the above (i) to (iii) are performed reversely.

(Method of Manufacturing Semiconductor Device)

The method of manufacturing the semiconductor device 105 in the fifth embodiment is the same as the flowchart illustrated in FIG. 11. FIG. 18 is a circuit diagram illustrating a configuration of the semiconductor device 105A with an open terminal.

In Step S31, the semiconductor device 105A with an open terminal P7 is prepared. In the state before burn-in, the terminal P7 is not connected to the terminal P3 with the metal wire W3.

At Step S32, a test voltage is applied to the control circuit B2. For example, with the terminal P7 in an open state, the test voltage is applied to the control circuit B2 by applying thereof between the terminal P9 and the terminal P3. A test voltage, with a maximum value of approximately 16 V being breakdown voltage of the Schottky barrier diode D6, is applied to the control circuit B2.

At this point, the gate GZ1 of the switching element Z1 and the resistor R3 are not connected to the terminal P3. This allows the gate oxide film of the switching element Z1 to be screened. A voltage for screening the gate oxide film (hereinafter referred to as gate oxide film test voltage) is applied between the terminal P10 and the terminal P3. For example, when the thickness of the gate oxide film of the switching element Z1 is 500 Å, it is preferable to apply a gate oxide film test voltage near the breakdown voltage (50 V) of the oxide film. For example, when a gate oxide film test voltage of 40 V is applied between the terminal P10 and the terminal P3, a current flows through the path of the resistor R3 to the resistor R2 to the Schottky barrier diode D6. At that point, when the breakdown voltage of the Schottky barrier diode D6 is about 16 V, a voltage of 24 V is applied to the resistors R2 and R3 together. The bidirectional Zener diode D8 reduces heat generation in the resistor R2 and the resistor R3. The degree of reduction in the heat generation can be adjusted depending on the number of the bidirectional Zener diodes D8 connected. Although in the fifth embodiment, the gate oxide film test voltage was applied via the terminal P10, when heat generation can be suppressed by the resistor R2 alone, the gate oxide test voltage may be applied via the terminal P7, that is, between the terminal P7 and the terminal P3.

The semiconductor device 105A that meets the specifications is screened by the test in above Step S32.

At Step S33, after burn-in, the terminal P7 is connected to the terminal P3 with the metal wire W3. Through this step, the semiconductor device 105 illustrated in FIG. 16 is completed. With such a connection configuration, the transistor T1 reduces the voltage drop across the Schottky barrier diode D2. Moreover, such a connection configuration enables the state of the switching element Z1 to be controlled by a signal input from the input terminal P1.

To summarize, the semiconductor device 105 according to the fifth embodiment further includes, in addition to the configuration of the semiconductor device 103 according to the third embodiment, the resistor R3 (resistor for voltage generation) connecting the gate of the transistor T1 and the gate GZ1 of the switching element Z1.

Such a semiconductor device 105 enables not only screening of the control circuit B2 but also screening of the gate oxide film of the switching element Z1. This improves selectability regarding the presence/absence of defects in the semiconductor device 105A.

The semiconductor device 105 may further include a P-channel MOSFET (not illustrated) connected in parallel with the P-channel MOSFET (T3) and driven during malfunction. Malfunction is, for example, malfunction at high temperature or overvoltage. This enhances the protection function.

Sixth Embodiment

A semiconductor device and a method of manufacturing the semiconductor device according to a sixth embodiment will be described. In the sixth embodiment, the same reference numerals are given to the same components as in the first to fifth embodiments, and detailed description thereof will be omitted.

Figure 20:
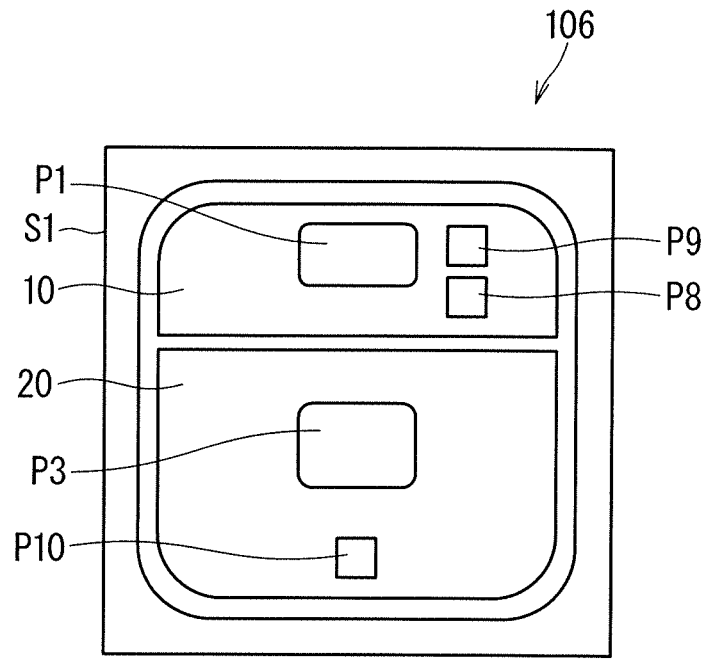
FIG. 20 A plan view illustrating the configuration of the semiconductor device on an upper surface thereof according to the fifth embodiment.

FIG. 19 is a circuit diagram illustrating a configuration of a semiconductor device 106 according to the sixth embodiment. FIG. 20 is a plan view illustrating the configuration of the semiconductor device 106 on the upper surface thereof according to the sixth embodiment.

The semiconductor device 106 includes a protection circuit A4, a control circuit B2, a switching element Z1, an input terminal P1, a terminal P2, a terminal P3, a terminal P8, a terminal P9, and a terminal P10 formed in one semiconductor substrate S1.

The protection circuit A4 has the configuration illustrated in the fourth embodiment. That is, the Zener diode D7 includes a cathode connected to the gate of the transistor T1 and an anode connected to the emitter of the switching element Z1. The Zener diode D7 is short-circuited. Also, a bidirectional Zener diode D8 is provided, if necessary. The terminal P8 is provided on the upper surface of the semiconductor substrate S1 as the gate of the transistor T1. No metal wire or the like is connected to the terminal P8. The terminal P3 is not short-circuited to the terminal P8 within the semiconductor substrate S1, that is, is insulated from the terminal P8.

The control circuit B2 has the configuration illustrated in the fifth embodiment. That is, the resistor R3 connects the gate of the transistor T1, the gate GZ1 of the switching element Z1 and the drain of the P-channel MOSFET (T4). (Method of Manufacturing Semiconductor Device)

The method of manufacturing the semiconductor device 106 in the sixth embodiment is the same as the flowchart illustrated in FIG. 15.

In Step S41, a semiconductor device in which the Zener diode D7 has not been short-circuited is prepared.

At Step S42, a test voltage is applied to the control circuit B2. For example, with the terminal P8 in an open state, the test voltage is applied to the control circuit B2 by applying thereof between the terminal P9 and the terminal P3. No current flows from the gate of the transistor T1 to the terminal P3. And the resistor R2 lies between the gate and the drain of the transistor T1. Therefore, when the test voltage is applied through the terminal P9, the transistor T1 is not driven. As a test voltage, a voltage (approximately 16 V) corresponding to the breakdown voltage of the Schottky barrier diode D6 is applied to the control circuit B2. A voltage of about 9 V is applied between the gate and the drain of the transistor T1. At this point, as in the fifth embodiment, the gate oxide film of the switching element Z1 is screened. When, for example, 40 V is applied between the terminal P10 and the terminal P3, a current flows through the path of the resistor R3 to the Zener diode D7. The resistor R3 is required to have the performance to withstand the heat generation at that point. Through this test, the semiconductor device that meets the specifications is screened.

In Step S43, after burn-in, the Zener diode D7 is short-circuited (Zener zapped). At this point, a voltage of about 35 V, for example, is applied between the gate of the transistor T1 and the emitter of the switching element Z1 as a voltage for short-circuiting. The voltage between the gate and the drain of the transistor T1 is approximately 19 V. The bidirectional Zener diode D8 reduces heat generation in each element in the current path. The degree of reduction in the heat generation can be adjusted depending on the number of the bidirectional Zener diodes D8 connected.

To summarize, the semiconductor device 106 according to the sixth embodiment further includes, in addition to the configuration of the semiconductor device 104 according to the fourth embodiment, the resistor R3 (resistor for voltage generation) connecting the gate of transistor T1 and the gate GZ1 of switching element Z1.

Such a semiconductor device 106 enables not only screening of the control circuit B2 but also screening of the gate oxide film of the switching element Z1. This improves selectability regarding the presence/absence of defects in the semiconductor device 106.

In the present disclosure, the embodiments can be combined, appropriately modified or omitted.

EXPLANATION OF REFERENCE SIGNS 10 circuit region, 20 switching element region, 101 to 106 semiconductor device, A1 to A4 protection circuit, B1 control circuit, B11 input, B12 output, B2 control circuit, C1 waveform shaping circuit, C2 constant current source, D1 Zener diode, D2 to D6 Schottky barrier diode, D7 Zener diode, D8 bidirectional Zener diode, GZ1 gate, P1 input terminal, P2 to P10 terminal, R1 to R3 resistor, S1 semiconductor substrate, T1 transistor, VDL power supply voltage line, W1 to W3 metal wire, Z1 switching element.

The invention claimed is:

1. A semiconductor device comprising:
   a switching element formed in a semiconductor substrate;
   a control circuit formed in the semiconductor substrate including the switching element and configured to control a state of the switching element;
   a Zener diode formed in the semiconductor substrate, including a cathode connected to a power supply voltage line between the control circuit and an input terminal to which a power supply voltage for driving the control circuit is input;
   a first terminal provided on a main surface of the semiconductor substrate as an anode of the Zener diode; and
   a second terminal provided on the main surface of the semiconductor substrate as one of an emitter and a source of the switching element and insulated from the first terminal within the semiconductor substrate.

2. The semiconductor device according to claim 1, further comprising
   external wiring connecting the first terminal and the second terminal.

3. A method of manufacturing a semiconductor device, comprising:

preparing a semiconductor device wherein a switching element, a control circuit configured to control a state of the switching element, and a Zener diode including a cathode connected to a power supply voltage line between the control circuit and an input terminal to which a power supply voltage for driving the control circuit is input are formed in one semiconductor substrate, and wherein the semiconductor device includes a first terminal provided on a main surface of the semiconductor substrate as an anode of the Zener diode, and a second terminal provided on the main surface of the semiconductor substrate as one of an emitter and a source of the switching element and insulated from the first terminal within the semiconductor substrate; and applying a test voltage to the control circuit via the first terminal, or applying a test voltage to the control circuit via the input terminal when the anode is in an open state, to test the control circuit.

4. The method of manufacturing the semiconductor device according to claim 3, further comprising connecting the first terminal and the second terminal with external wiring.

5. A semiconductor device comprising:

a switching element formed in a semiconductor substrate;

a control circuit formed in the semiconductor substrate including the switching element and configured to control a state of the switching element;

a Zener diode formed in the semiconductor substrate, including a cathode connected to a power supply voltage line between the control circuit and an input terminal to which a power supply voltage for driving the control circuit is input;

a first terminal provided on a main surface of the semiconductor substrate, separating the power supply voltage line within the semiconductor substrate between the cathode of the Zener diode and the control circuit, and connected to an input of the control circuit; and a second terminal provided on the main surface of the semiconductor substrate as the cathode of the Zener diode, and, together with the first terminal, separating the power supply voltage line within the semiconductor substrate between the cathode of the Zener diode and the control circuit.

6. The semiconductor device according to claim 5, further comprising external wiring connecting the first terminal and the second terminal to form the power supply voltage line.

7. A method of manufacturing a semiconductor device, comprising:

preparing a semiconductor device wherein a switching element, a control circuit configured to control a state of the switching element, and a Zener diode including a cathode connected to a power supply voltage line between the control circuit and an input terminal to which a power supply voltage for driving the control circuit is input are formed in one semiconductor substrate, and wherein the semiconductor device includes a first terminal provided on a main surface of the semiconductor substrate and separating the power supply voltage line within the semiconductor substrate between the cathode of the Zener diode and the control circuit and connected to an input of the control circuit and a second terminal provided on the main surface of the semiconductor substrate as the cathode of the Zener diode, and, together with the first terminal, separating the power supply voltage line within the semiconductor substrate between the cathode of the Zener diode and the control circuit; and applying a test voltage to the control circuit via the first terminal to test the control circuit.

8. The method of manufacturing the semiconductor device according to claim 7, further comprising forming the power supply voltage line by connecting the first terminal and the second terminal with external wiring.

9. A semiconductor device comprising:

a switching element formed in a semiconductor substrate;

a control circuit formed in the semiconductor substrate including the switching element and configured to control a state of the switching element;

a Zener diode formed in the semiconductor substrate, including a cathode connected to a power supply voltage line between the control circuit and an input terminal to which a power supply voltage for driving the control circuit is input;

a transistor formed in the semiconductor substrate and connected in parallel with the power supply voltage line;

a resistor formed in the semiconductor substrate and provided between a gate and a drain of the transistor;

a first terminal provided on a main surface of the semiconductor substrate as the gate of the transistor; and a second terminal provided on the main surface of the semiconductor substrate as one of an emitter and a source of the switching element and insulated from the first terminal within the semiconductor substrate.

10. The semiconductor device according to claim 9, further comprising external wiring connecting the first terminal and the second terminal.

11. The semiconductor device according to claim 9, further comprising a resistor for voltage generation connecting the gate of the transistor and the gate of the switching element.

12. A method of manufacturing a semiconductor device, comprising:

preparing a semiconductor device wherein a switching element, a control circuit configured to control a state of the switching element, a Zener diode including a cathode connected to a power supply voltage line between the control circuit and an input terminal to which a power supply voltage for driving the control circuit is input, a transistor connected in parallel with the power supply voltage line, and a resistor provided between a gate and a drain of the transistor are formed in one semiconductor substrate, and wherein the semiconductor device includes a first terminal provided on a main surface of the semiconductor substrate as the gate of the transistor and a second terminal provided on the main surface of the semiconductor substrate as one of an emitter and a source of the switching element and insulated from the first terminal within the semiconductor substrate; and applying a test voltage to the control circuit via the first terminal, or applying a test voltage to the control circuit via a third terminal connected to the power supply voltage line between the drain of the transistor and the control circuit to test the control circuit.

13. The method of manufacturing the semiconductor device according to claim 12, further comprising connecting the first terminal and the second terminal with external wiring.

14. A semiconductor device comprising:

a switching element formed in a semiconductor substrate;

a control circuit formed in the semiconductor substrate including the switching element and configured to control a state of the switching element;

a Zener diode formed in the semiconductor substrate, including a cathode connected to a power supply voltage line between the control circuit and an input terminal to which a power supply voltage for driving the control circuit is input;

a transistor formed in the semiconductor substrate and connected in parallel with the power supply voltage line;

a resistor formed in the semiconductor substrate and provided between a gate and a drain of the transistor;

a Zener diode for short-circuiting formed in the semiconductor substrate, and including a cathode connected to the gate of the transistor and an anode connected to one of an emitter and a source of the switching element; and a gate terminal provided on a main surface of the semiconductor substrate as the gate of the transistor.

15. The semiconductor device according to claim 14, wherein the Zener diode for short-circuiting has been short-circuited.

16. The semiconductor device according to claim 14, further comprising

18 a resistor for voltage generation connecting the gate of the transistor and the gate of the switching element.

17. A method of manufacturing a semiconductor device, comprising:

preparing a semiconductor device wherein a switching element, a control circuit configured to control a state of the switching element, a Zener diode including a cathode connected to a power supply voltage line between the control circuit and an input terminal to which a power supply voltage for driving the control circuit is input, a transistor connected in parallel with the power supply voltage line, a resistor provided between a gate and a drain of the transistor, and a Zener diode for short-circuiting including a cathode connected to the gate of the transistor and an anode connected to one of an emitter and a source of the switching element are formed in one semiconductor substrate, and wherein the semiconductor device includes a gate terminal provided on a main surface of the semiconductor substrate as the gate of the transistor; and applying a test voltage to the control circuit via the gate terminal, or applying a test voltage to the control circuit via a third terminal connected to the power supply voltage line between the drain of the transistor and the control circuit to test the control circuit.

18. The method of manufacturing the semiconductor device according to claim 17, further comprising applying a voltage for short-circuiting to the Zener diode for short-circuiting.

* * * * *